(12) United States Patent
Pal et al.

(10) Patent No.: US 7,632,727 B2
(45) Date of Patent: Dec. 15, 2009

(54) METHOD OF FORMING STEPPED RECESSES FOR EMBEDDED STRAIN ELEMENTS IN A SEMICONDUCTOR DEVICE

(75) Inventors: Rohit Pal, Fishkill, NY (US); Frank Bin Yang, Mahwah, NJ (US); Michael Hargrove, Clinton Corners, NY (US)

(73) Assignee: GlobalFoundries Inc., Grand Caymen (KY)

( * ) Notice: Subject to any disclaimer, the term of this patent is extended or adjusted under 35 U.S.C. 154(b) by 0 days.

(21) Appl. No.: 12/119,384

(22) Filed: May 12, 2008

(65) Prior Publication Data

US 2009/0280627 A1 Nov. 12, 2009

(51) Int. Cl.
*H01L 29/772* (2006.01)
(52) U.S. Cl. ................. 438/197; 438/514; 257/E21.085
(58) Field of Classification Search ................. 438/514, 438/524, 527, 217, 232, 289, 197; 257/E21.085
See application file for complete search history.

(56) References Cited

U.S. PATENT DOCUMENTS

| 7,071,046 | B2 * | 7/2006 | Yang et al. | 438/197 |
| 7,429,775 | B1 * | 9/2008 | Nayak et al. | 257/369 |
| 2008/0128746 | A1 * | 6/2008 | Wang | 257/190 |

\* cited by examiner

*Primary Examiner*—Matthew Smith
*Assistant Examiner*—Michele Fan
(74) *Attorney, Agent, or Firm*—Ingrassia, Fisher & Lorenz, P.C.

(57) ABSTRACT

A method of fabricating a semiconductor transistor device is provided. The fabrication method begins by forming a gate structure overlying a layer of semiconductor material, such as silicon. Then, spacers are formed about the sidewalls of the gate structure. Next, ions of an amorphizing species are implanted into the semiconductor material at a tilted angle toward the gate structure. The gate structure and the spacers are used as an ion implantation mask during this step. The ions form amorphized regions in the semiconductor material. Thereafter, the amorphized regions are selectively removed, resulting in corresponding recesses in the semiconductor material. In addition, the recesses are filled with stress inducing semiconductor material, and fabrication of the semiconductor transistor device is completed.

14 Claims, 4 Drawing Sheets

METHOD OF FORMING STEPPED RECESSES FOR EMBEDDED STRAIN ELEMENTS IN A SEMICONDUCTOR DEVICE

TECHNICAL FIELD

Embodiments of the subject matter described herein relate generally to semiconductor devices. More particularly, embodiments of the subject matter relate to fabrication of semiconductor transistors having embedded strain elements with stepped profiles.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. In addition, embedded strain elements (i.e., doped/undoped semiconductor material that strains the channel region) can be used to improve the performance of MOS transistors. In this regard, FIG. 1 is a cross sectional view of a MOS transistor device structure 100 having such embedded strain elements 102 located within a layer of semiconductor material 104. FIG. 1 depicts MOS transistor device structure 100 at an intermediate stage in the overall fabrication process.

In practice, the minimum distance between doped embedded strain elements in the semiconductor material (near the channel region) is limited due to the out-diffusion of the doped species into the channel region. Such out-diffusion exacerbates the short channel effect (SCE) that occurs in MOS transistors fabricated using modern small scale process nodes, for example, 45 nm nodes and beyond. To better control SCE, MOS transistor device structure 100 employs embedded strain elements 102 having a stepped profile, as shown in FIG. 1. The stepped profile results in a relatively narrow separation between the upper portions 106 of embedded strain elements 102, and a relatively wide separation between the lower portions 108 of embedded strain elements 102. This structure facilitates the realization of shallow junctions for better SCE control.

The conventional technique for fabrication of stepped embedded strain elements requires multiple photolithography, etching, and spacer formation steps. Referring to FIG. 1, dual-recess cavities 110 in semiconductor material 104 are formed in the following manner. After formation of a gate stack 112, sidewall spacers 114, and offset spacers 116, an appropriate etch mask is formed. Then, first recesses are etched into semiconductor material 104; these first recesses will be aligned with offset spacers 116. The first recesses represent the relatively deep pockets of dual-recess cavities 110. After formation of the first recesses, offset spacers 116 are removed (as indicated by the dashed lines in FIG. 1) and an appropriate etch mask is formed. Then, second recesses are etched into semiconductor material 104. These second recesses will be aligned with sidewall spacers 114. The second recesses represent the relatively shallow extensions of dual-recess cavities 110. This process, which employs multiple masking and etching steps, can be expensive, time consuming, and difficult to control.

BRIEF SUMMARY

A method of fabricating a semiconductor device is provided herein. The method involves forming a gate structure overlying a layer of semiconductor material, forming spacers adjacent sidewalls of the gate structure, and implanting ions of an amorphizing species at a tilted angle toward the gate structure and into the semiconductor material, using the gate structure and the spacers as an implantation mask. The ion implantation forms amorphized regions in the semiconductor material, which are then selectively removed, resulting in corresponding recesses in the semiconductor material. Thereafter, the recesses are at least partially filled with stress inducing semiconductor material.

A method of fabricating a semiconductor transistor device is also provided. This method provides a substrate having formed thereon a device structure having a layer of silicon material, a gate structure overlying the layer of silicon material, and spacers adjacent sidewalls of the gate structure. The method also involves amorphizing portions of the silicon material to form amorphized silicon regions that extend under the spacers, isotropically etching away the amorphized silicon regions, resulting in corresponding shallow recesses in the layer of silicon material, and anisotropically etching the silicon material to deepen the shallow recesses, resulting in stepped recesses in the silicon material. Thereafter, the stepped recesses are at least partially filled with stress inducing semiconductor material.

Another embodiment of a method of fabricating a semiconductor device is also provided. This method involves providing a substrate having a layer of semiconductor material, forming a gate structure overlying the layer of semiconductor material, and forming spacers adjacent sidewalls of the gate structure. The method also performs tilted ion implantation, using the gate structure and the spacers as an implantation mask, to change portions of the semiconductor material into amorphized regions that extend toward each other under the spacers. In addition, the method selectively removes the amorphized regions, resulting in corresponding recesses in the semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 7:
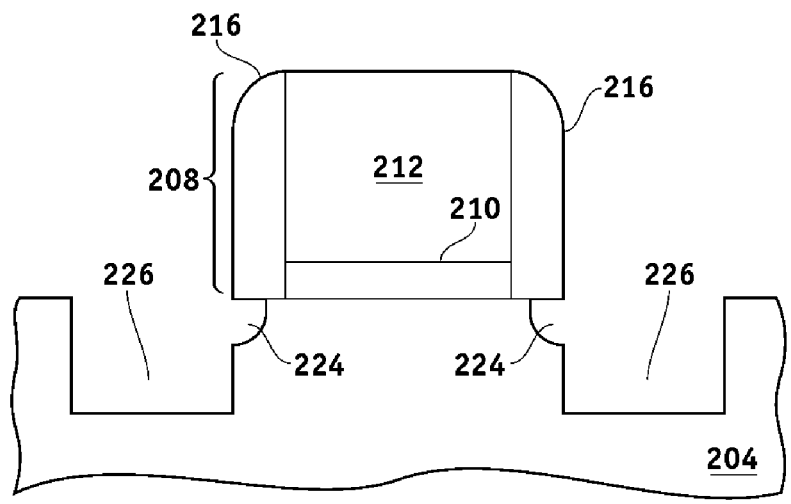
Figure 8:
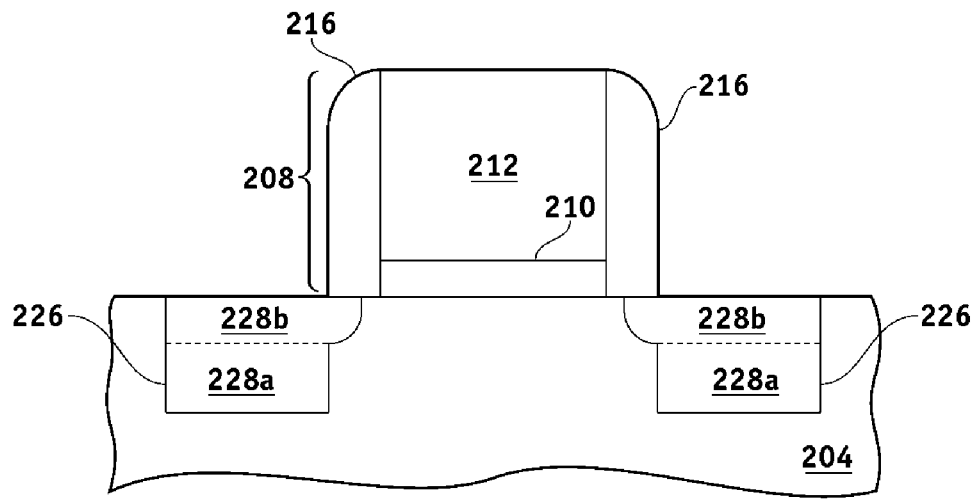
Figure 9:
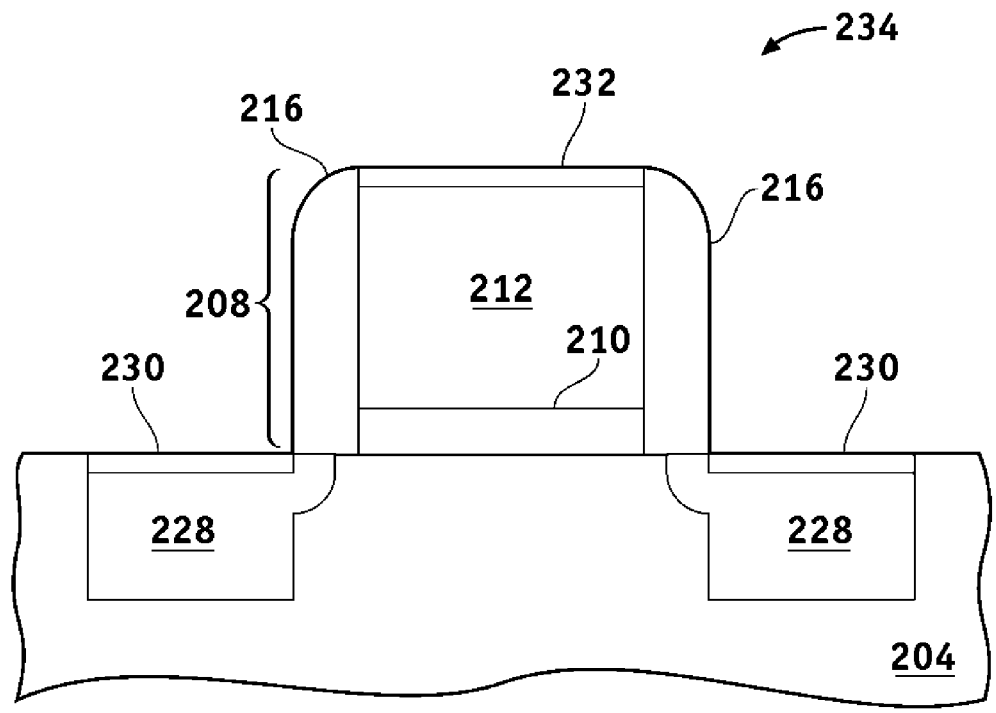

The semiconductor device manufacturing process described herein is suitable for use with 45 nm node technology, 32 nm node technology, and beyond, however, the use of such node technologies is not a requirement. The manufacturing process creates dual-recess cavities having stepped profiles, as generally depicted in FIGS. 7-9. Notably, these stepped cavities are created using only one disposable spacer rather than multiple spacers (as required by conventional techniques). The stepped cavities are formed by using angled silicon-amorphizing implants to damage the silicon such that the damaged silicon has a desired profile. Thereafter, the amorphized silicon is selectively etched away to form shallow recesses. Deeper sections of the recesses are then etched, using the disposable spacer as a self-aligning etch mask. After the stepped recesses are formed in this manner, they can be filled with strain inducing semiconductor material.

FIGS. 2-9 are cross sectional views that illustrate an exemplary MOS transistor device structure and a method of fabricating the MOS transistor device structure—the MOS transistor device structure may ultimately take the form of an NMOS transistor device or a PMOS transistor device. The description of well known and conventional steps related to the fabrication of semiconductor devices may be briefly summarized or omitted entirely without providing the well known process details.

Figure 1:
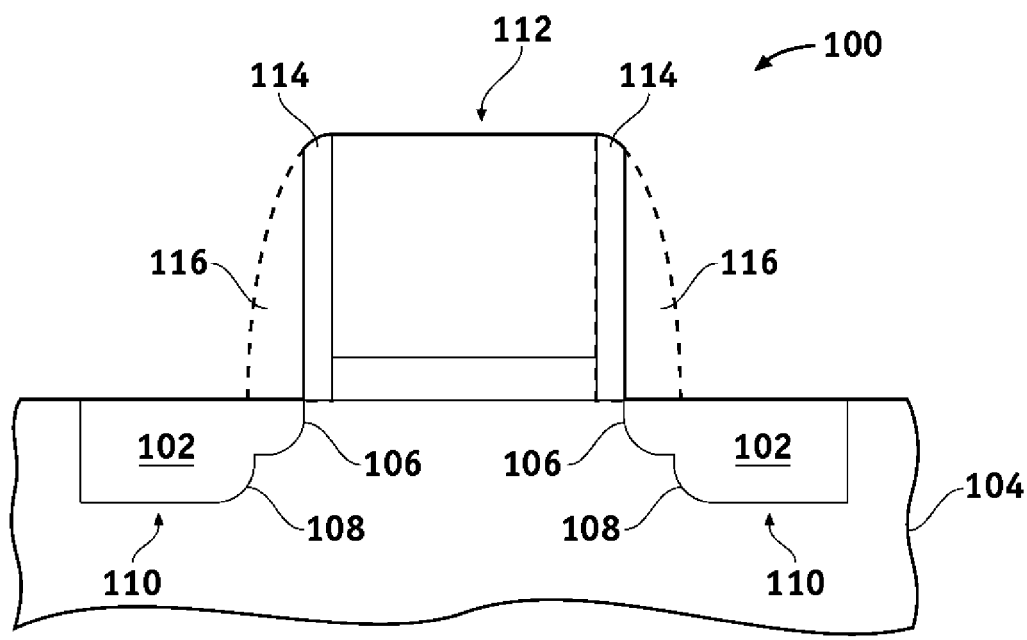
FIG. 1 is a cross sectional view of a prior art MOS transistor device structure having embedded strain elements located within a layer of semiconductor material.
Figure 2:
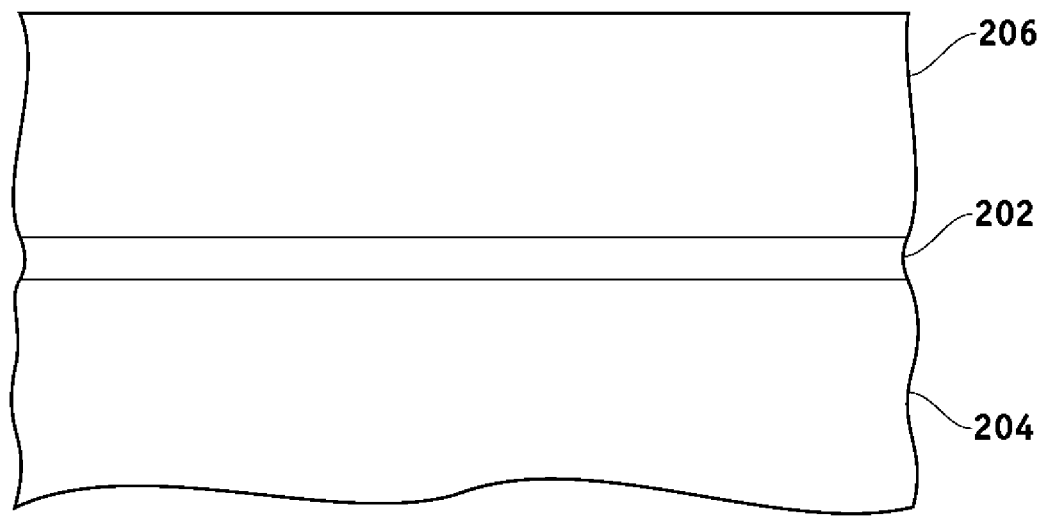
FIGS. 2-9 are cross sectional views that illustrate an exemplary MOS transistor device structure and a method of fabricating the MOS transistor device structure.

Referring to FIG. 2, the fabrication process begins by forming a gate insulator material 202 overlying a layer of semiconductor material 204. The semiconductor material 204 is preferably a silicon material as typically used in the semiconductor industry, e.g., relatively pure silicon as well as silicon admixed with other elements such as germanium, carbon, and the like. Alternatively, semiconductor material 204 can be germanium, gallium arsenide, or the like. Semiconductor material 204 can be either N-type or P-type, but is typically P-type. Moreover, semiconductor material 204 may be part of a bulk semiconductor wafer, or it may be realized as a thin layer of semiconductor material on an insulating substrate (commonly known as semiconductor-on-insulator or SOI) that, in turn, is supported by a carrier wafer.

Gate insulator material 202 can be a layer of thermally grown silicon dioxide or, alternatively (as illustrated), a deposited insulator such as a silicon oxide, silicon nitride, or the like. Deposited insulators can be deposited, for example, by chemical vapor deposition (CVD), low pressure chemical vapor deposition (LPCVD), or plasma enhanced chemical vapor deposition (PECVD). Gate insulator material 202 preferably has a thickness of about 1-10 nm, although the actual thickness can be determined based on the application of the transistor in the circuit being implemented.

A layer of gate electrode material 206 is formed overlying gate insulator material 202. In accordance with one embodiment, gate electrode material 206 is polycrystalline silicon. The layer of polycrystalline silicon is preferably deposited as undoped polycrystalline silicon and is subsequently impurity doped by ion implantation. The polycrystalline silicon can be deposited by LPCVD by the hydrogen reduction of silane. A layer of hard mask material (not shown), such as silicon nitride or silicon oxynitride, can be deposited onto the surface of the polycrystalline silicon. The hard mask material can be deposited to a thickness of about 50 nm, also by LPCVD.

Figure 3:
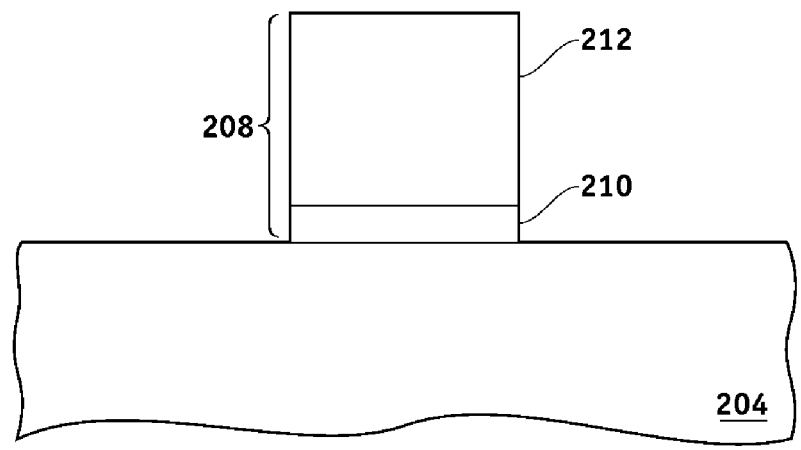

The hard mask layer is photolithographically patterned and the underlying gate electrode material 206 and gate insulator material 202 are etched to form a gate structure (also referred to as a gate stack) 208 having a gate insulator 210 and a gate electrode 212, as illustrated in FIG. 3. The polycrystalline silicon can be etched in the desired pattern by, for example, reactive ion etching (RIE) using a chlorine or $HBr/O_2$ chemistry and the hard mask and gate insulating material can be etched, for example, by RIE in a $CHF_3$, $CF_4$, or $SF_6$ chemistry.

Figure 4:
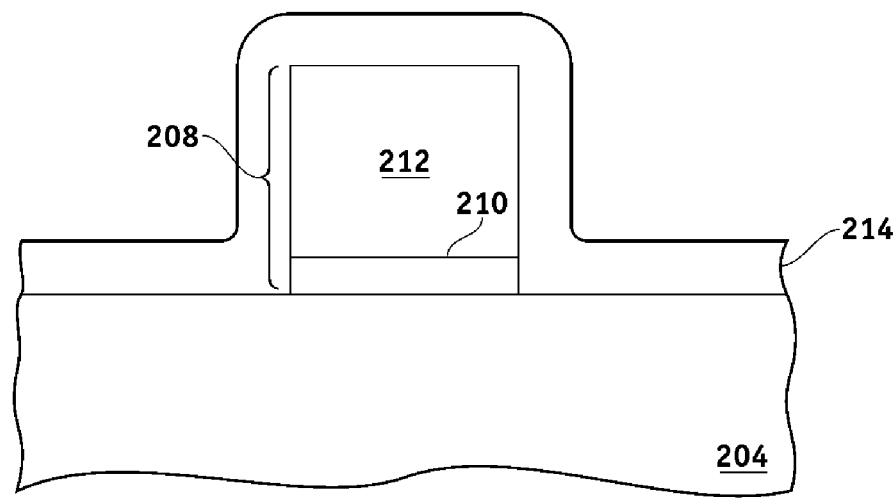

Referring to FIG. 4, a layer 214 of dielectric material is conformally deposited overlying gate structure 208. The dielectric material is an appropriate insulator, such as silicon oxide and/or silicon nitride, preferably silicon nitride. The dielectric material can be deposited in a known manner by, for example, atomic layer deposition (ALD), CVD, LPCVD, semi-atmospheric chemical vapor deposition (SACVD), or PECVD. Layer 214 is deposited to a thickness so that, after anisotropic etching, spacers formed from layer 214 have a thickness that is appropriate for the subsequent ion implantation and etching steps described below. In typical implementations, the layer 214 of dielectric material is deposited to a thickness of about 5-50 nm.

Figure 5:
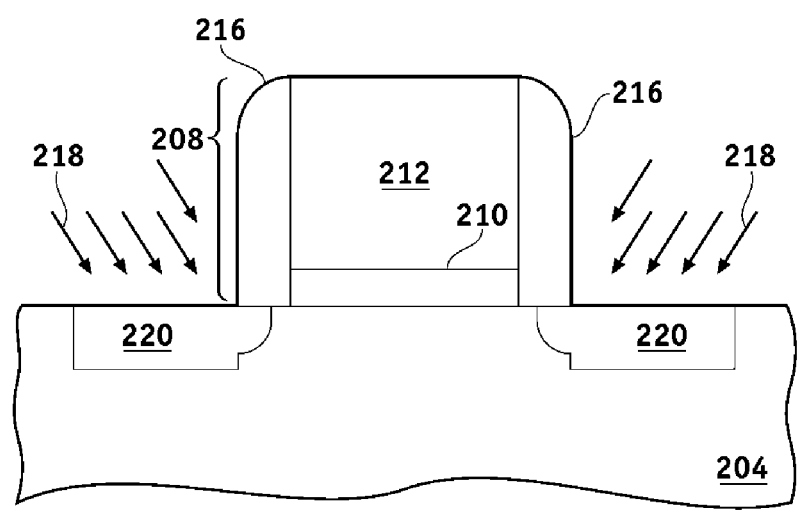

The process continues, in accordance with an exemplary embodiment, with anisotropic etching of the layer 214 of dielectric material to form spacers 216, as illustrated in FIG. 5. The layer 214 of dielectric material can be etched by, for example, RIE using a suitable etching chemistry. As shown, the resulting spacers 216 are formed such that they are adjacent to the sidewalls of gate structure 208. Thereafter, gate structure 208 and spacers 216 are used as an ion implantation mask during a tilted ion implantation step. The arrows in FIG. 5 schematically represent the implantation of ions 218 at a tilted angle relative to the surface of semiconductor material 204, and toward gate structure 208. Notably, the ions 218 are of an amorphizing species having properties and characteristics that enable it to amorphize semiconductor material 204. In other words, when the ions 218 are implanted into semiconductor material 204, they alter or damage the normally regular and consistent crystalline lattice structure of semiconductor material 204. For this particular embodiment, the species can be xenon (Xe), germanium (Ge), silicon (Si), or the like, which demonstrates an ability to amorphize silicon material in the manner described here.

The use of a tilted ion implantation technique is desirable to change portions of semiconductor material 204 into amorphized regions 220 having the desired shape, dimensions, and profile in semiconductor material 204. In practice, the tilted angle and dosage of the ions 218 are controlled such that amorphized regions 220 extend under spacers 216 and toward gate structure 208, as shown in FIG. 5. In practice, the angle of incidence of ions 218, relative to the surface of semiconductor material 204, can be within the range of about 0-40 degrees, but will depend on the depth and width (under the spacers) of amorphization desired. The dosage of ions 218 may be within the range of $10^{13}$ atoms/cm$^2$ to $10^{14}$ atoms/cm$^2$, but will depend on the depth and width (under the spacers) of amorphization desired. The tilted angle promotes amorphizing of semiconductor material 204 under spacers 216 such that the ends of amorphized regions 220 extend toward each other under spacers 216 and toward the channel region. Notably, the outer edges of spacers 216 overlap amorphized regions 220.

Figure 6:
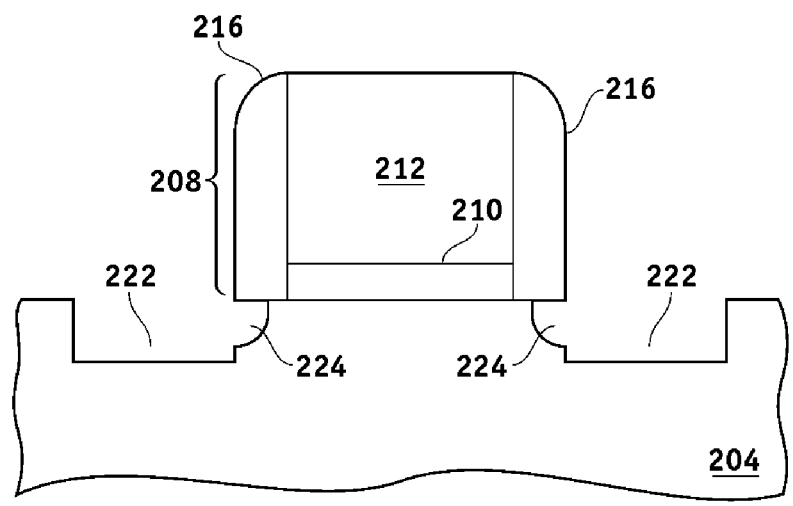

Although other fabrication steps or sub-processes may be performed after the formation of amorphized regions 220 (e.g., a breakthrough etch step to remove native oxide), this example continues with an etching step that selectively removes amorphized regions 220, while leaving the remainder of semiconductor material 204 substantially intact. This etching step results in recesses 222 being formed in semiconductor material 204, as shown in FIG. 6. For this embodiment, the process employs an isotropic etch technique to etch away amorphized regions 220. This isotropic etch step may utilize plasma etching with a chlorine based chemistry to achieve the desired shallow recess profile. As a result of this etch, recesses 222 include respective pockets 224 under spacers 216, and at least a portion of each spacer 216 overhangs a pocket 224 (see FIG. 6).

Although other fabrication steps or sub-processes may be performed after the formation of recesses 222, this example continues by increasing the depth of recesses 222. In accordance with the illustrated embodiment, the semiconductor material 204 at the bottom of recesses 222 is further etched to increase the depth of recesses 222. In this regard, a breakthrough etch may be followed by an anisotropic etch using, for example, a $CF_4$ based chemistry. Thus, semiconductor material 204 is directionally etched, using gate structure 208 and spacers 216 as a self-aligned etch mask, to deepen and extend recesses 222 (see FIG. 7). This etching step is controlled to form stepped recesses 226 in semiconductor material 204, where stepped recesses 226 have the desired overall depth. Notably, stepped recesses 226 are formed without any photolithography or etching steps related to the formation of additional spacers.

Although other fabrication steps or sub-processes may be performed after the formation of stepped recesses 226, this example continues by at least partially filling stepped recesses 226 with a stress inducing semiconductor material, preferably a doped silicon based material. FIG. 8 shows stepped recess 226 after they have been filled with stress inducing semiconductor material 228. In this embodiment, stress inducing semiconductor material 228 is formed by selectively epitaxially growing an in situ doped silicon material in stepped recesses 226. As used here, "in situ doped" means that a suitable dopant is introduced into a host material as that host material is grown. Epitaxially grown in situ doped silicon material is utilized here such that the material need not be subjected to ion implantation for purposes of doping.

For an NMOS transistor device, the in situ doped semiconductor material is an N-type semiconductor material, such as in situ phosphorus doped silicon carbon, or other materials that have a smaller lattice constant than silicon, such as a compound semiconductor, or the like. In contrast, for a PMOS transistor device, the in situ doped semiconductor material is a P-type semiconductor material, such as in situ boron doped silicon germanium, or other materials that have a greater lattice constant than silicon, such as a compound semiconductor, or the like. When fabricating CMOS devices, the stepped recesses of PMOS devices will be masked during the growth of the epitaxial material for NMOS devices, and vice versa.

The embodiment depicted in FIG. 8 employs a non-uniform doping profile for stress inducing semiconductor material 228. For example, the deeper regions of stress inducing semiconductor material (identified by reference number 228a) may have relatively high doping, while the shallower regions of stress inducing semiconductor material (identified by reference number 228b) may have relatively low doping. Such non-uniform doping can be controlled and achieved while the material is being epitaxially grown.

Although other fabrication steps or sub-processes may be performed at this time (e.g., thermal annealing, formation of additional spacers, etc.), this example continues by forming metal silicide contact areas 230 on stress inducing semiconductor material 228. In addition, a metal silicide contact area 232 may be formed on polycrystalline silicon gate electrode 212, as depicted in FIG. 9. It should be apparent that FIG. 9 depicts a device structure 234 after a number of known process steps have been performed. For the sake of brevity, these intermediate steps will not be described in detail. In practice, an appropriate silicidation process is performed to create metal silicide contact areas 230 and 232. For example, a layer of silicide-forming metal (not shown) is deposited onto the surface of stress inducing semiconductor material 228 and onto the surface of gate electrode 212. The silicide-forming metal can be deposited, for example, by sputtering to a thickness of about 5-50 nm and preferably to a thickness of about 10 nm. The wafer is then heated, for example by rapid thermal annealing, to form metal silicide contact areas 230 and 232. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Thereafter, any number of known process steps can be performed to complete the fabrication of the MOS transistor device. For the sake of brevity, these process steps and the resulting MOS transistor device are not shown or described here. A MOS transistor device can be manufactured in this manner such that it has stepped recesses for strain elements, without having to carry out the additional process steps associated with the conventional process.

Figure 10:
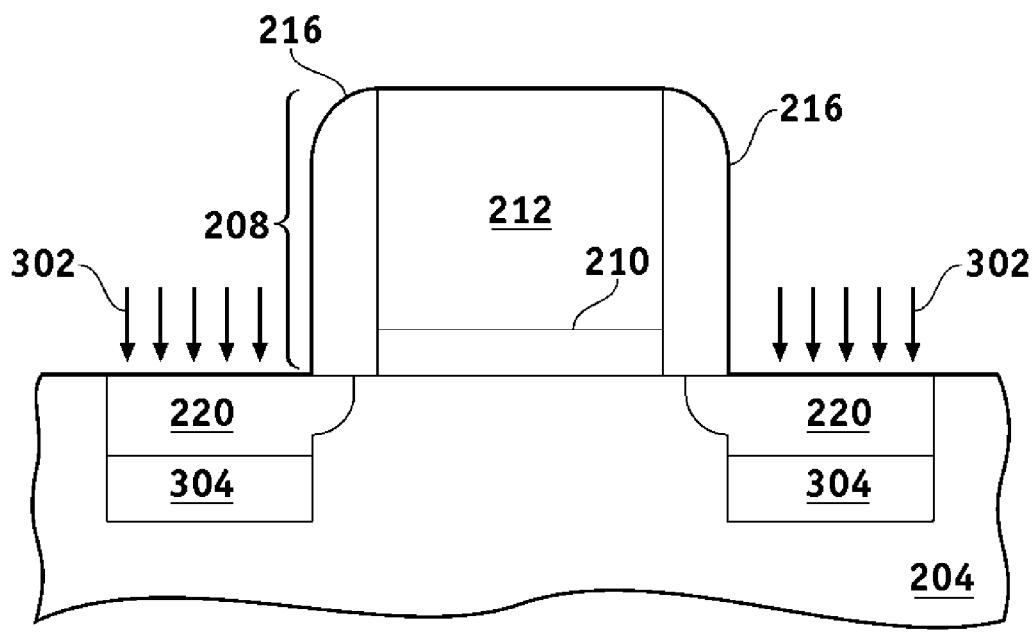
FIG. 10 is a cross sectional view of an exemplary MOS transistor device structure and an alternate fabrication step that can be incorporated into the process shown in FIGS. 2-9.

FIG. 10 illustrates an alternative step that can be utilized in another embodiment of the fabrication process. For consistency with the above description, FIG. 10 depicts a step that can be performed following the tilted ion implantation step shown in FIG. 5. In this alternate embodiment, ions 302 of an amorphizing species (preferably the same species used in the tilted ion implantation step, namely, xenon, germanium, silicon, etc.) are implanted into semiconductor material 204 at a non-tilted angle relative to gate structure 208. In other words, ions 302 approach the exposed surface of semiconductor material 204 at an angle of approximately ninety degrees, as depicted in FIG. 10. This non-tilted ion implantation step uses gate structure 208 and spacers 216 as a self-aligned implant mask to deepen amorphized regions 220. In FIG. 10, reference number 304 represents the extended depth of amorphized regions 220. The specific implant angle and dosage of the ions 302 are controlled to deepen amorphized regions 220/304 by the desired amount. The orthogonal ion implantation angle is desirable to preserve the already-formed shallow extensions of amorphized regions 220, which are located under spacers 216.

After the deeper amorphized regions 220/304 have been created, the process may continue with a breakthrough etch step and, thereafter, an etching step that selectively removes the deeper amorphized regions 220/304. Isotropic etching (as described above with reference to FIG. 6) may be utilized here. Notably, this alternative embodiment need not utilize a subsequent anisotropic etch to extend the depth of amorphized regions 220, as mentioned above. Nonetheless, this alternate process still forms stepped recesses 226 as shown in FIG. 7. Therefore, the remainder of the process described above may also apply to this alternate embodiment.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   forming a gate structure overlying a layer of semiconductor material;
   forming spacers adjacent sidewalls of the gate structure;
   implanting ions of an amorphizing species at a tilted angle toward the gate structure and into the semiconductor material, using the gate structure and the spacers as an implantation mask, to form amorphized regions in the semiconductor material;
   selectively removing the amorphized regions while the spacers remain intact and without forming additional spacers, resulting in corresponding recesses in the semiconductor material;
   deepening the recesses while the spacers remain intact and without forming additional spacers, to form deepened recesses in the semiconductor material; and
   at least partially filling the deepened recesses with stress inducing semiconductor material by epitaxially growing in situ doped semiconductor material in the deepened recesses, wherein a non-uniform doping profile is used as the in situ doped semiconductor material is being epitaxially grown, resulting in relatively high doping in deeper regions of the stress inducing semiconductor material, and relatively low doping in shallower regions of the stress inducing semiconductor material.

2. The method of claim 1, wherein implanting ions comprises implanting xenon ions into the semiconductor material.

3. The method of claim 1, wherein selectively removing the amorphized regions comprises isotropically etching the amorphized regions.

4. The method of claim 1, wherein implanting ions comprises controlling the tilted angle and dosage of the amorphizing species such that the amorphized regions extend under the spacers and toward the gate structure.

5. The method of claim 1, further comprising implanting ions of the amorphizing species at a non-tilted angle relative to the gate structure and into the semiconductor material, using the gate structure and the spacers as a self-aligned implantation mask to deepen the amorphized regions, prior to selectively removing the amorphized regions.

6. A method of fabricating a semiconductor transistor device, the method comprising:
   providing a substrate having formed thereon a device structure having a layer of silicon material, a gate structure overlying the layer of silicon material, and spacers adjacent sidewalls of the gate structure;
   amorphizing portions of the silicon material to form amorphized silicon regions that extend under the spacers;
   isotropically etching away the amorphized silicon regions while the spacers remain intact and without forming additional spacers, resulting in corresponding shallow recesses in the layer of silicon material;
   anisotropically etching the silicon material to deepen the shallow recesses while the spacers remain intact and without forming additional spacers, resulting in stepped recesses in the silicon material; and
   at least partially filling the stepped recesses with stress inducing semiconductor material by epitaxially growing in situ doped silicon material in the stepped recesses, wherein a non-uniform doping profile is used as the in situ doped semiconductor material is being epitaxially grown, resulting in relatively high doping in deeper regions of the stress inducing semiconductor material, and relatively low doping in shallower regions of the stress inducing semiconductor material.

7. The method of claim 6, wherein amorphizing portions of the silicon material comprises implanting ions of an amorphizing species at a tilted angle toward the gate structure and into the silicon material, using the gate structure and the spacers as an implantation mask.

8. The method of claim 7, wherein implanting ions comprises implanting xenon ions into the silicon material.

9. The method of claim 6, wherein: the semiconductor transistor device is an NMOS transistor device; and the in situ doped silicon material is silicon carbon.

10. The method of claim 6, wherein: the semiconductor transistor device is a PMOS transistor device; and the in situ doped silicon material is silicon germanium.

11. The method of claim 6, wherein anisotropically etching the silicon material uses the gate structure and the spacers as a self-aligned etch mask.

12. A method of fabricating a semiconductor device, the method comprising:
   providing a substrate having a layer of semiconductor material;
   forming a gate structure overlying the layer of semiconductor material;
   forming spacers adjacent sidewalls of the gate structure;
   performing tilted ion implantation, using the gate structure and the spacers as an implantation mask, to change portions of the semiconductor material into amorphized regions that extend toward each other under the spacers;

selectively removing the amorphized regions while the spacers remain intact and without forming additional spacers, resulting in corresponding recesses in the semiconductor material;

increasing the depth of the recesses while the spacers remain intact and without forming additional spacers, to form deepened recesses in the semiconductor material; and filling the deepened recesses with stress inducing semiconductor material by epitaxially growing in situ doped semiconductor material in the deepened recesses, wherein a non-uniform doping profile is used as the in situ doped semiconductor material is being epitaxially grown, resulting in relatively high doping in deeper regions of the stress inducing semiconductor material, and relatively low doping in shallower regions of the stress inducing semiconductor material.

13. The method of claim 12, wherein increasing the depth of the recesses comprises anisotropically etching the semiconductor material, using the gate structure and the spacers as an etch mask.

14. The method of claim 12, wherein performing tilted ion implantation comprises implanting xenon ions into the semiconductor material.

\* \* \* \* \*